(12) United States Patent
Yamamoto

(10) Patent No.: US 12,533,951 B2
(45) Date of Patent: Jan. 27, 2026

(54) DISPLAY DEVICE

(71) Applicant: Japan Display Inc., Tokyo (JP)

(72) Inventor: Mitsunori Yamamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 305 days.

(21) Appl. No.: 18/094,426

(22) Filed: Jan. 9, 2023

(65) Prior Publication Data

US 2023/0158888 A1 May 25, 2023

Related U.S. Application Data

(63) Continuation of application No. PCT/JP2021/020558, filed on May 28, 2021.

(30) Foreign Application Priority Data

Jul. 14, 2020 (JP) .................................. 2020-120881

(51) Int. Cl.
  *B60K 35/22* (2024.01)
  *B60K 35/50* (2024.01)
  *B60K 35/81* (2024.01)
  *G09F 9/30* (2006.01)
  *G09F 9/40* (2006.01)

(52) U.S. Cl.
  CPC .............. *B60K 35/22* (2024.01); *B60K 35/50* (2024.01); *B60K 35/81* (2024.01)

(58) Field of Classification Search
  CPC ... B60K 35/22; G09F 9/30; G09F 9/40; G02F 1/1333; G02F 2201/50; G02F 2201/56
  See application file for complete search history.

(56) References Cited

U.S. PATENT DOCUMENTS

| | | | |
|---|---|---|---|
| 6,307,613 B1 | 10/2001 | Iida | |
| 7,279,063 B2* | 10/2007 | Yokajty | H10K 50/8426 |
| | | | 156/275.7 |
| 2014/0092583 A1 | 4/2014 | Franklin et al. | |
| 2016/0351848 A1* | 12/2016 | Kodama | H10K 77/111 |

(Continued)

FOREIGN PATENT DOCUMENTS

| | | |
|---|---|---|
| JP | 2016-049934 A | 4/2016 |
| JP | 2019-174764 A | 10/2019 |

(Continued)

OTHER PUBLICATIONS

Japanese Office Action mailed on Jan. 23, 2024, for the corresponding Japanese Patent Application No. 2020-120881, with English machine translation.

(Continued)

*Primary Examiner* — Joanna Pleszczynska
(74) *Attorney, Agent, or Firm* — Michael Best & Friedrich LLP

(57) ABSTRACT

A display device includes a front plate including a display region that is translucent and a peripheral region that is different from the display region, and a display panel provided opposite at least the display region of the front plate. The front plate includes a plurality of alignment marks provided in the peripheral region at positions corresponding to a plurality of display-panel-side alignment marks provided on the display panel, and a plurality of first marks each having a linear shape and extending along an outer periphery of the display panel.

6 Claims, 14 Drawing Sheets

(56) References Cited

U.S. PATENT DOCUMENTS

| | | | |
|---|---|---|---|
| 2019/0343009 A1* | 11/2019 | Kim | H05K 5/0217 |
| 2020/0019001 A1 | 1/2020 | Shibata | |
| 2021/0008862 A1 | 1/2021 | Kato et al. | |
| 2023/0347638 A1 | 11/2023 | Kato et al. | |

FOREIGN PATENT DOCUMENTS

| | | |
|---|---|---|
| JP | 2020-001223 A | 1/2020 |
| JP | 2020-008758 A | 1/2020 |
| WO | 2016/113908 A1 | 7/2016 |

OTHER PUBLICATIONS

International Search Report mailed on Aug. 10, 2021, for the corresponding PCT Application PCT/JP2021/020558, with English translation.

Chinese Office Action mailed on Dec. 13, 2024 for the corresponding Chinese Patent Application No. 202180045940.0, with English machine translation.

Chinese Office Action dated Jun. 11, 2025 for the corresponding Chinese Patent Application No. 202180045940.0, with English machine translation.

\* cited by examiner

DISPLAY DEVICE

CROSS-REFERENCE TO RELATED APPLICATION

This application is a continuation of International Patent Application No. PCT/JP2021/020558 filed on May 28, 2021 which designates the United States, incorporated herein by reference, and which claims the benefit of priority from Japanese Patent Application No. 2020-120881 filed on Jul. 14, 2020, incorporated herein by reference.

BACKGROUND

1. Technical Field

The present invention relates to a display device.

2. Description of the Related Art

Japanese Patent Application Laid-open Publication No. 2020-8758 discloses a display device in which a display panel and a protection member are bonded to each other. A reference mark for position alignment is formed on each of the display panel and the protection member, and the display panel and the protection member are disposed so that the reference mark of the display panel and the reference mark of the protection member are placed over each other. WO 2016/113908, Japanese Patent Application Laid-open Publication No. 2016-49934, Japanese Patent Application Laid-open Publication No. 2019-174764 (JP-A-2019-174764), and Japanese Patent Application Laid-open Publication No. 2020-1223 (JP-A-2020-1223) each disclose a display device in which a plurality of display panels are bonded to one front plate (also referred to as a protection plate or a protection panel).

For such a display device, it is potentially difficult to check the position accuracy (existence of positional error) of a display panel after the front plate and the display panel are bonded to each other. For example, in the display device disclosed in each of JP-A-2019-174764 and JP-A-2020-1223, the front plate and the display panels are curved and the distance between an alignment mark provided on each display panel and an alignment mark provided on the front plate differs with the position and angle of observation with a camera, and thus positional error of the display panel potentially cannot be accurately detected.

SUMMARY

A display device according to an embodiment of the present disclosure includes a front plate including a display region that is translucent and a peripheral region that is different from the display region, and a display panel provided opposite at least the display region of the front plate. The front plate includes a plurality of alignment marks provided in the peripheral region at positions corresponding to a plurality of display-panel-side alignment marks provided on the display panel, and a plurality of first marks each having a linear shape and extending along an outer periphery of the display panel.

A display device according to an embodiment of the present disclosure includes a front plate including a curved surface part, and a plurality of display panels provided on the front plate and bonded along the front plate. The front plate includes a plurality of alignment marks provided at positions corresponding to a plurality of display-panel-side alignment marks provided on the display panel, and a plurality of first marks each having a linear shape and provided along an outer periphery of the display panel.

DETAILED DESCRIPTION

Aspects (embodiments) of the present disclosure will be described below in detail with reference to the accompanying drawings. Contents described below in the embodiments do not limit the present disclosure. Components described below include those that could be easily thought of by the skilled person in the art and those identical in effect. The components described below may be combined as appropriate. What is disclosed herein is merely exemplary, and any modification that could be easily thought of by the skilled person in the art as appropriate without departing from the gist of the disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present disclosure and drawings, any element same as that already described with reference to an already described drawing is denoted by the same reference sign, and detailed description thereof is omitted as appropriate in some cases.

In the present specification and the claims, an expression with "on" in description of an aspect in which one structural body is disposed on another structural body includes both a case in which the one structural body is directly disposed on the other structural body in contact and a case in which the one structural body is disposed above the other structural body with still another structural body interposed therebetween, unless otherwise stated in particular.

Figure 1:
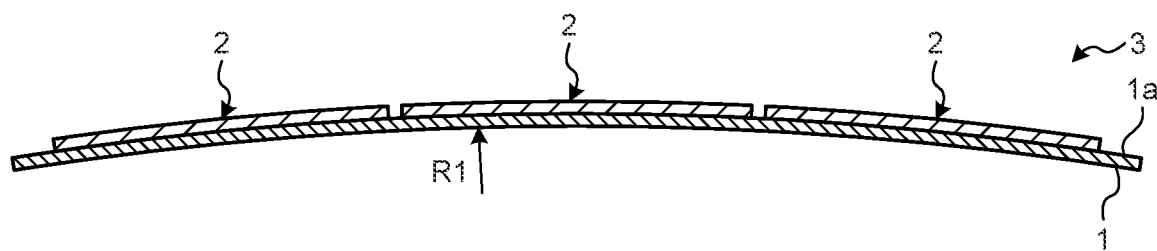
FIG. 1 is a schematic section diagram of a display device according to a first embodiment.
Figure 2:
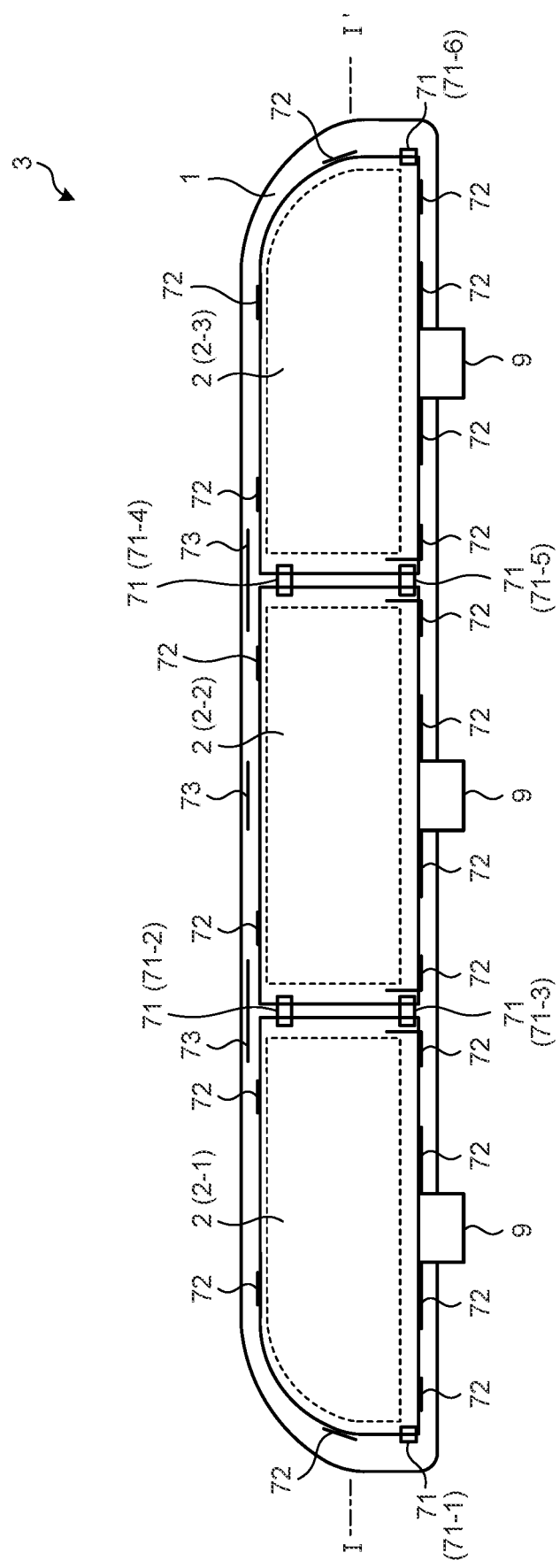
FIG. 2 is a schematic plan view of the display device according to the first embodiment.
Figure 3:
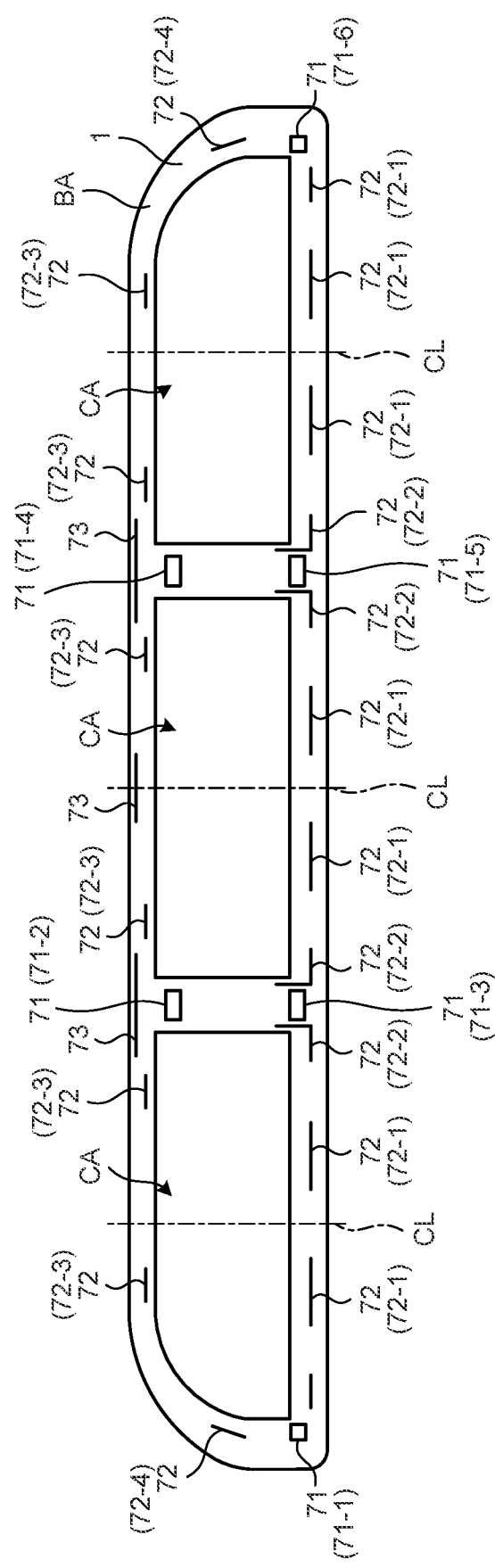
FIG. 3 is a schematic plan view of a front plate according to the first embodiment.

FIG. 1 is a schematic section diagram of a display device according to a first embodiment. FIG. 2 is a schematic plan view of the display device according to the first embodiment. FIG. 3 is a schematic plan view of a front plate according to the first embodiment. FIG. 1 illustrates a section I-I' in FIG. 2. FIG. 3 is a plan view of a front plate 1 except for a plurality of display panels 2 in FIG. 2.

As illustrated in FIG. 1, a display device 3 according to the first embodiment includes the front plate 1 and three display panels 2. The three display panels 2 are bonded to the front plate 1 with an interval therebetween. Each display panel 2 is smaller than the front plate 1 in a plan view.

The front plate 1 is a cover member that protects the display panels 2. The display panels 2 are disposed on one side of the front plate 1 and attached to the front plate 1 through a non-illustrated adhesive layer. As illustrated in FIG. 2, the front plate 1 is substantially rectangular in a plan view and chamfered at corners in curved line shapes. The front plate 1 is symmetric in a right-left direction. However, the shape of the front plate 1 is not limited thereto but may be, for example, asymmetric in the right-left direction.

As illustrated in FIG. 1, the front plate 1 is entirely curved at a curvature R1. The front plate 1 is made of translucent glass or synthesis resin. Accordingly, light from the display panels 2 transmits through the front plate 1. When viewed from a viewer, an image is displayed on a display surface along the surface of the front plate 1. The front plate 1 formed of glass is also referred to as a cover glass.

Each display panel 2 is, for example, a liquid crystal panel or an organic light-emitting diode panel (hereinafter, referred to as an OLED panel). The liquid crystal panel or the OLED panel may include a touch panel. When the display panel 2 is a liquid crystal panel, a backlight 8 (refer to FIG. 11) is provided on a back side of the display panel 2 (side opposite the front plate 1). The display panel 2 includes a first substrate and a second substrate that are formed of glass or the like, and a liquid crystal layer sandwiched between the first substrate and the second substrate. A wiring substrate 9 is coupled to the display panel 2. The wiring substrate 9 is, for example, a flexible printed board.

As illustrated in FIG. 2, for example, a display panel 2-2 positioned at a central part is rectangular in a plan view. Display panels 2-1 and 2-3 positioned on the right and left sides of the display panel 2-2 each have a shape with a curved line part provided at part of its outer shape in a plan view.

As illustrated in FIG. 1, each display panel 2 is curved in a sectional view, and when viewed from the viewer, both ends of the display panel 2 in one direction are positioned closer than the center thereof in the one direction. As illustrated in FIG. 1, the front plate 1 includes a curved surface part having a constant curvature across the entire surface. The front surface of the display panel 2 is bonded to a second surface 1a of the front plate 1 and curved along and bonded to the front plate 1. However, the present invention is not limited thereto, and the front plate 1 may include a plurality of curved surface parts having different curvatures. The front plate 1 is not limited to a curved surface part with a concave surface, but may include a curved surface part with a convex surface or may be formed in an S sectional shape as a combination of a curved surface part with a concave surface and a curved surface part with a convex surface.

The following describes a plurality of alignment marks provided on the front plate 1 with reference to FIGS. 2 and 3. It should be noted that, among sides on the outer periphery of each display panel 2, a side coupled to the corresponding wiring substrate 9 and extending in the one direction is referred to as a "bottom side" in some cases in the following description. A side positioned opposite the bottom side and extending in the one direction is referred to as a "top side" in some cases. Sides extending in a direction orthogonal to the one direction are referred to as a "left-hand side" and a "right-hand side" in some cases.

As illustrated in FIG. 3, the front plate 1 includes a display region CA that is translucent, and a peripheral region BA that is different from the display region CA. A plurality of the display regions CA are arrayed on the one front plate 1 in the one direction with the peripheral region BA sandwiched therebetween. The display panels 2 are provided opposite the respective display regions CA and curved along and bonded to the front plate 1.

The peripheral region BA is a light-shielded region in which, for example, a colored decorative layer or a metal layer is formed. The peripheral region BA is printed, for example, in black. However, in FIGS. 2 and 3 and the like, the peripheral region BA is not filled with the color for convenience of description.

The front plate 1 includes a plurality of alignment marks 71, a plurality of first marks 72, and a plurality of second marks 73 provided in the peripheral region BA. The alignment marks 71, the first marks 72, and the second marks 73 are printed, for example, in white on a black printing layer. However, each alignment mark is not limited to white but may be any color in a combination with which observation is possible in clear contrast against a decorative layer.

The alignment marks 71 are provided for position alignment of each display panel 2 and the front plate 1 when the display panel 2 is to be bonded to the front plate 1. The alignment marks 71 are provided at positions corresponding to display-panel-side alignment marks 75 (refer to FIG. 4) provided on the display panel 2.

Three alignment marks 71-1, 71-2, and 71-3 are provided around the display region CA on the left side in FIG. 3. Four alignment marks 71-2, 71-3, 71-4, and 71-5 are provided around the display region CA at the central part. Three alignment marks 71-4, 71-5, and 71-6 are provided around the display region CA on the right side. When not need to be distinguished from one another in the following description, the alignment marks 71-1, 71-2, 71-3, 71-4, 71-5, and 71-6 are simply referred to as alignment marks 71.

The alignment marks 71-2 and 71-3 are provided between the display region CA on the left side and the display region CA at the central part and used for both positioning of the display panel 2-1 and positioning of the display panel 2-2 illustrated in FIG. 2. The alignment marks 71-4 and 71-5 are provided between the display region CA at the central part and the display region CA on the right side and used for both positioning of the display panel 2-2 and positioning of the display panel 2-3 illustrated in FIG. 2.

The alignment marks 71 each have a quadrangular shape. For example, the alignment marks 71-1 and 71-6 each have a square shape whereas the alignment marks 71-2, 71-3, 71-4, and 71-5 each have a rectangular shape, and thus the alignment marks have shapes different from each other. It should be noted that, the alignment marks 71 are not limited to a quadrangular shape but may have any shape with which image recognition is possible, such as a circular shape, a cross shape, or a polygonal shape.

The first marks 72 are each provided to check position accuracy (existence of positional error) of the corresponding display panel 2 after the display panels 2 and the front plate 1 are bonded to each other. The first marks 72 are each formed in a linear shape extending along the outer periphery of the corresponding display panel 2. A line width (width in a direction orthogonal to the extending direction) of each of the first marks 72 is smaller than the width of each alignment mark 71. The shape and line width of each of the first marks 72 are different from those of each display-panel-side alignment mark 75 (refer to FIG. 4).

Specifically, a plurality of first marks 72-1 each extend in the one direction along the bottom side of the corresponding display panel 2. Two first marks 72-1 are separately disposed on respective sides of a central line CL of the corresponding display panel 2 in the one direction. In other words, two first marks 72-1 are each provided at a position superimposing no wiring substrate 9.

A plurality of first marks 72-2 are each formed in an L shape corresponding to a corner on the bottom side of the corresponding display panel 2. The first marks 72-2 are each formed in an L shape in which a part extending along the bottom side of the corresponding display panel 2 is coupled to a part extending along the left-hand side or right-hand side of the display panel 2.

A plurality of first marks 72-3 each extend in the one direction along the top side of the corresponding display panel 2. The first marks 72-3 are provided in the peripheral region BA on a side opposite the first marks 72-1 with respect to the display regions CA. The length of each first mark 72-3 in the extending direction is shorter than that of each first mark 72-1.

A plurality of first marks 72-4 each extend along a curved line part of the corresponding display panel 2 at a tilt relative to the one direction. The first marks 72-4 are provided in a region on one end side of the peripheral region BA in the one direction and a region on the other end side.

The second marks 73 are each provided to check position accuracy (existence of positional error) of the corresponding backlight 8 after the backlight 8 is bonded to the back surface of the corresponding display panel 2. The second marks 73 are each provided between the corresponding first mark 72 and the outer periphery of the front plate 1. The second marks 73 are each formed in a linear shape extending along the outer periphery of the front plate 1. The second marks 73 are each provided between the top side of the corresponding display panel 2 and the outer periphery of the front plate 1 after the display panel 2 and the front plate 1 are bonded to each other.

It should be noted that, the numbers and positions of the alignment marks 71, the first marks 72, and the second marks 73 are merely exemplary and may be changed as appropriate.

Figure 4:
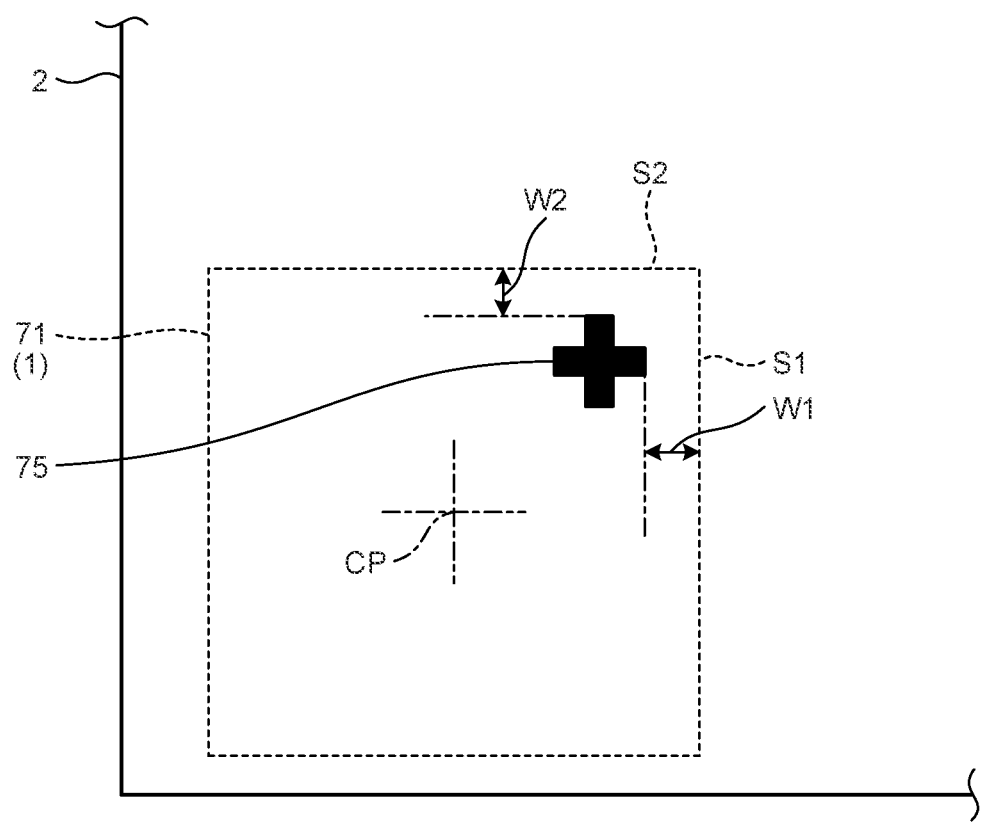
FIG. 4 is a plan view schematically illustrating exemplary position alignment of a display panel and the front plate.
Figure 5:
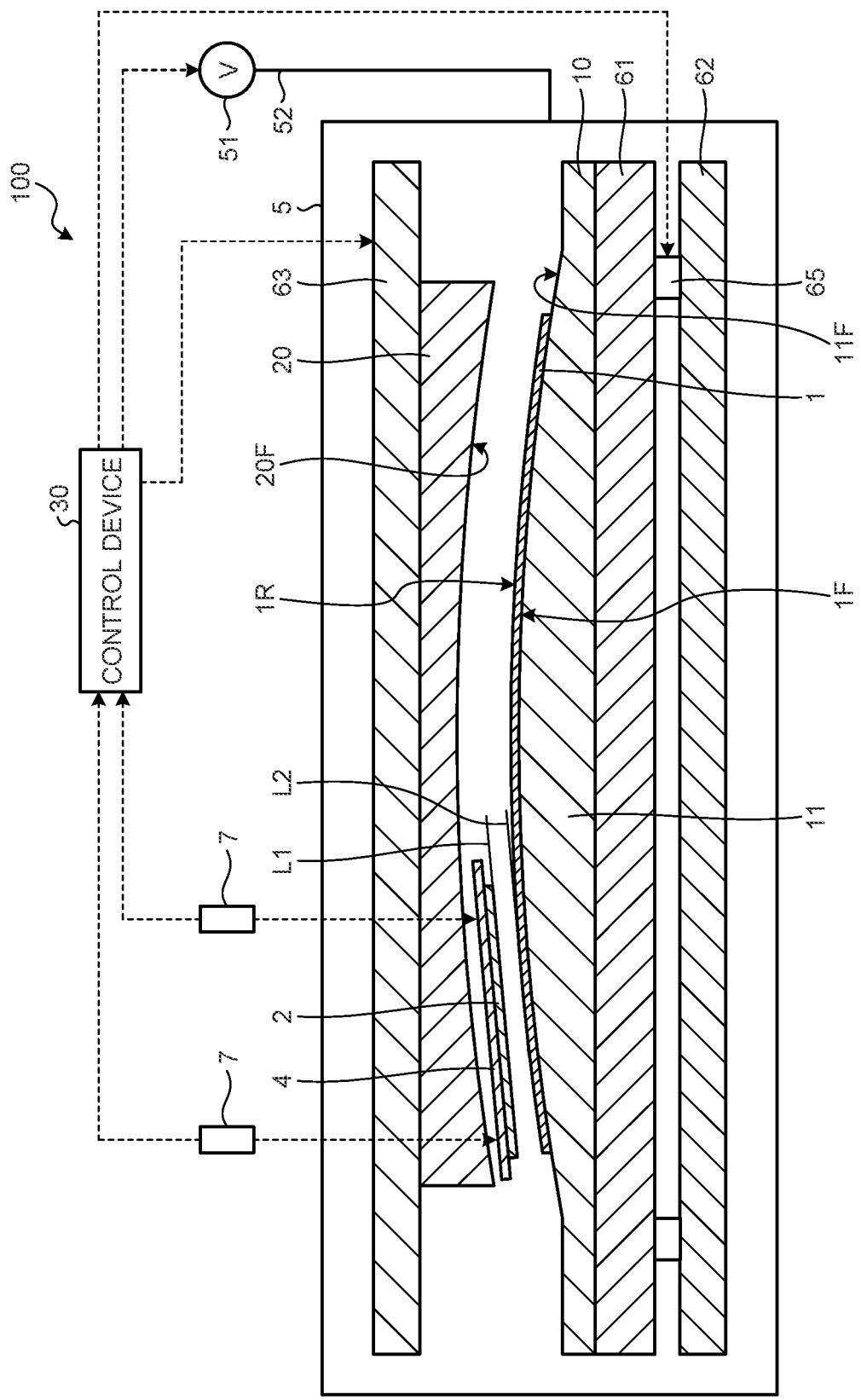
FIG. 5 is a configuration diagram of a press bonding device according to the first embodiment.
Figure 6:
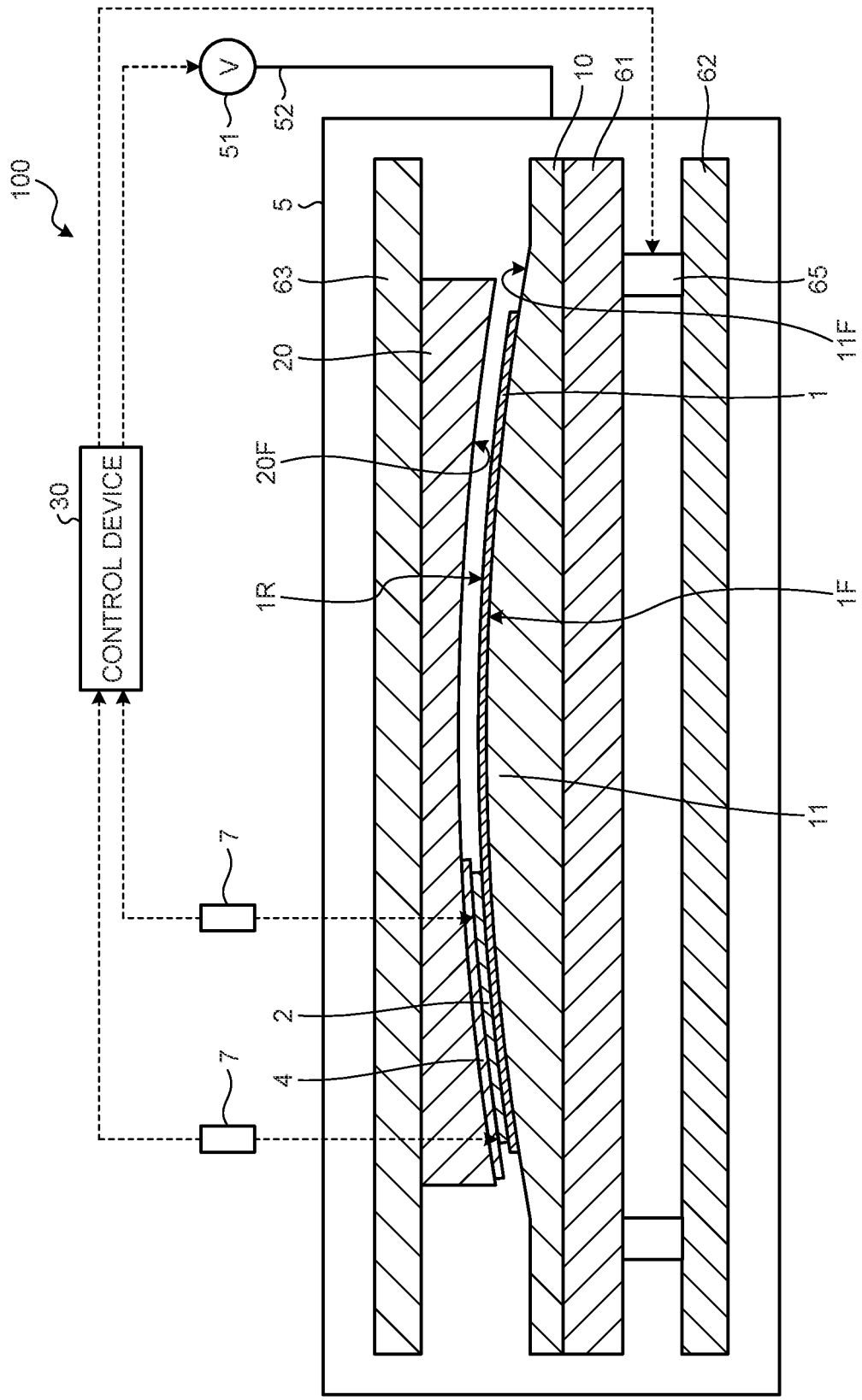
FIG. 6 is a configuration diagram for describing operation of the press bonding device.
Figure 7:
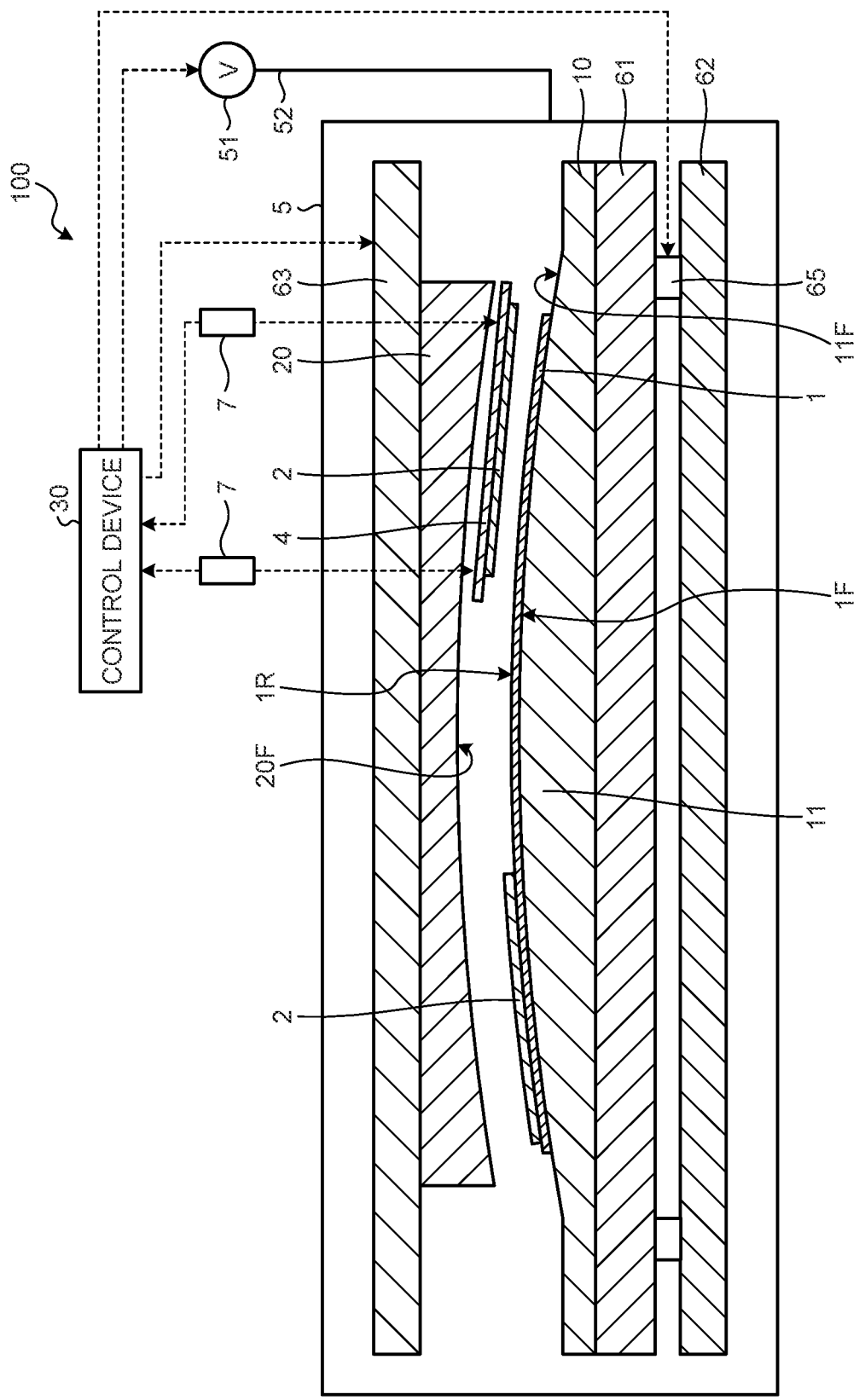
FIG. 7 is a configuration diagram for describing the operation of the press bonding device.
Figure 8:
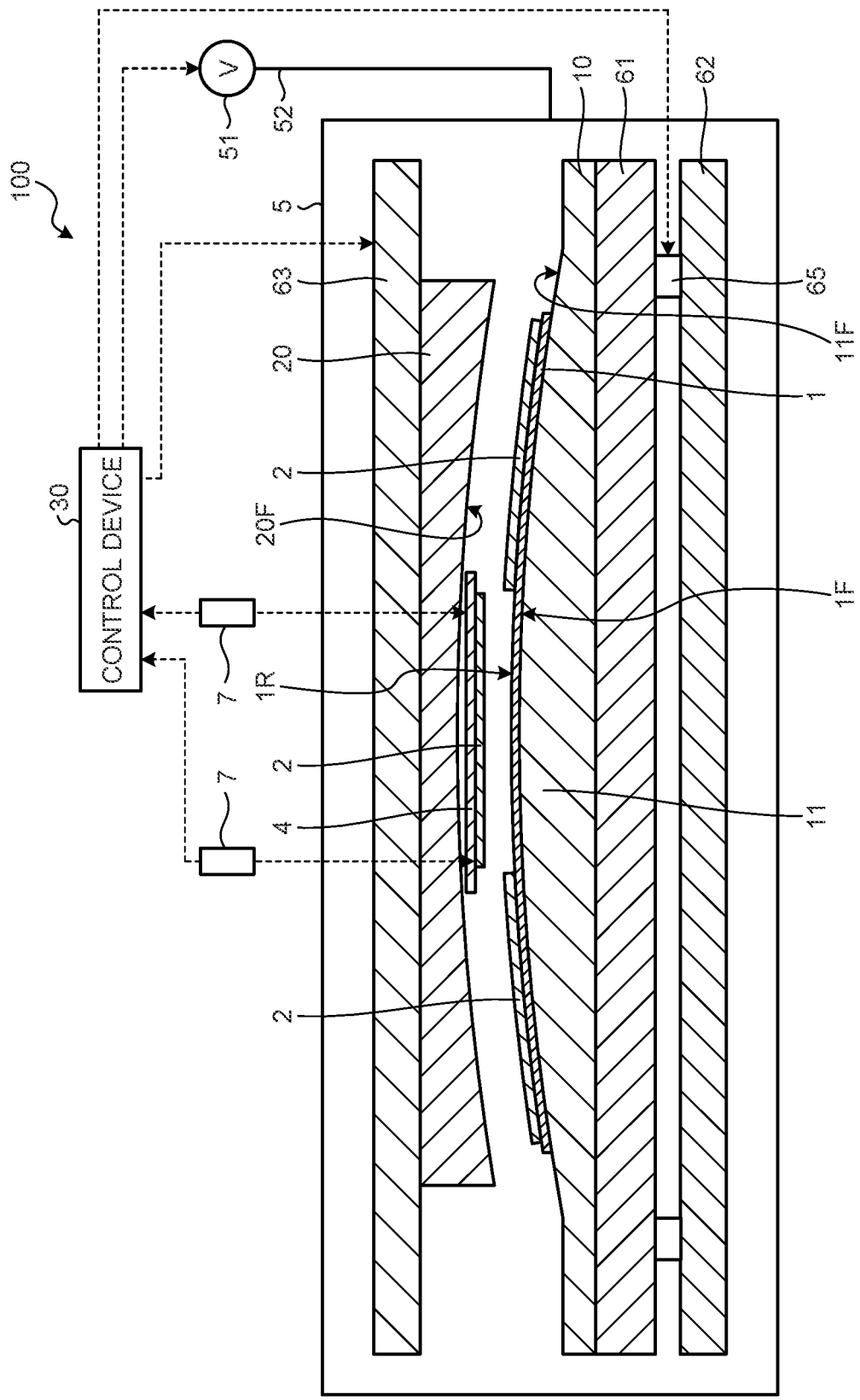
FIG. 8 is a configuration diagram for describing the operation of the press bonding device.

The following describes a position alignment method and a position accuracy check method for each display panel 2. FIG. 4 is a plan view schematically illustrating exemplary position alignment of the display panel and the front plate. FIG. 5 is a configuration diagram of a press bonding device according to the first embodiment. FIGS. 6 to 8 are configuration diagrams for description of operation of the press bonding device. As illustrated in FIG. 5, a press bonding device 100 includes a vacuum chamber 5, a vacuum source 51, a stage 10, an elastic body 20, a fixation table 62, installation tables 61 and 63, a vertical movement device 65, a pipe 52, and a control device 30. The press bonding device 100 also includes a camera 7.

The vacuum chamber 5 is a container that houses the stage 10, the fixation table 62, the installation tables 61 and 63, and the vertical movement device 65. The vacuum source 51 is a pump and discharges air in the vacuum chamber 5 through the pipe 52 to depressurize the vacuum chamber 5 to pressure below atmospheric pressure.

The stage 10 is a jig disposed in the vacuum chamber 5 and used to fix the front plate 1 in close contact to a fixation part 11 along the surface of the curved surface part. The installation table 61 installs the stage 10. The interval between the fixation table 62 and the installation table 61 can be changed as appropriate by the vertical movement device 65. The vertical movement device 65 moves upward and downward the installation table 61 relative to the fixation table 62 when driven by a drive mechanism such as a hydraulic drive mechanism or a motor drive mechanism based on a control command from the control device 30. The installation table 63 is coupled to an XY stage and movable on an XY plane when driven by a drive mechanism such as a motor based on a control command from the control device 30.

The elastic body 20 is an elastic base. The elastic body 20 is formed of, for example, a sheet synthetic rubber or elastomer having a uniform film thickness when no force is applied. The elastic member may be natural rubber. The elastic body 20 is fixed to a surface of the installation table 63 on a side closer to the installation table 61. As illustrated in FIG. 5, the elastic body 20 has a force receiving surface 20F having a concave shape along a fixation surface 11F of the fixation part 11.

A carrier sheet 4 is an elastic member. The elastic member is formed of, for example, a sheet synthetic rubber or elastomer having a uniform film thickness when no force is applied. The elastic member may be natural rubber.

The display panel 2 is bonded to the carrier sheet 4 through the adhesive layer or the like in advance. The carrier sheet 4 is positioned to a predetermined position where the display panel 2 overlaps the front plate 1 in a plan view. The carrier sheet 4 is sandwiched between the elastic body 20 and the stage 10 in a non-contact manner. A sectional line L1 of an attachment surface of the carrier sheet 4 to which the display panel 2 is attached is parallel to a tangent line L2 of the facing front plate 1 at the minimum distance.

The control device 30 is a computer including at least, for example, a central processing unit (CPU), which is an arithmetic device, and a memory, which is a storage device. The control device 30 can achieve various functions by executing a computer program by using these hardware resources.

Specifically, the control device 30 reads a computer program stored in a predetermined storage (not illustrated), loads the computer program onto the memory, and causes the CPU to execute commands included in the computer program loaded onto the memory. The control device 30 controls the pressure in the vacuum chamber 5 by controlling operation of the vacuum source 51. The control device 30 controls the distance between the installation table 61 and the installation table 63 by controlling operation of the vertical movement device 65. Accordingly, the distance between the elastic body 20 and the stage 10 changes in accordance with drive of the vertical movement device 65.

The control device 30 calculates position coordinates of the front plate 1 on the XY plane and position coordinates of the display panel 2 on the XY plane based on image data from the camera 7. The control device 30 controls operation of the XY stage based on results of the calculations, thereby controlling the position of the installation table 63. Accordingly, position alignment of the display panel 2 and the front plate 1 is performed.

As illustrated in FIG. 4, the control device 30 calculates the position of a central place CP of each alignment mark 71 provided on the front plate 1 based on image data from the camera 7. The control device 30 also calculates the position of an intersection point of the corresponding display-panel-side alignment mark 75 based on image data from the camera 7. The control device 30 moves the installation table 63 based on results of the calculations so that the display-panel-side alignment mark 75 overlaps the alignment mark 71. Accordingly, position alignment of the display panel 2 and the front plate 1 is performed.

It should be noted that, although FIG. 4 illustrates a pair of the display-panel-side alignment mark 75 and the alignment mark 71, the control device 30 detects the display-panel-side alignment marks 75 and the alignment marks 71 provided around the display panel 2 and calculates the positions of the display panel 2 and the front plate 1. FIG. 4 is merely exemplary, and the method of recognizing each alignment mark 71 with the camera 7 is not limited thereto. For example, the position of each alignment mark 71 may be calculated by recognizing edges of at least two sides (sides S1 and S2) of the alignment mark 71. Each display-panel-side alignment mark 75 has a cross shape but is not limited thereto. Each display-panel-side alignment mark 75 may have any other shape with which image recognition is possible.

The following describes a display device manufacturing method using the press bonding device 100 described above. First, in a preparation process, the first display panel 2 (display panel 2-1) is attached to the carrier sheet 4 in the vacuum chamber 5 through the adhesive layer as illustrated in FIG. 5. In this case, another adhesive layer is bonded to a side on which the display panel 2 faces the front plate 1. The adhesive layer on the carrier sheet 4 side has smaller adhesive force than the adhesive layer on the side facing the front plate 1.

In addition, in the preparation process, the front plate 1 is in close contact fixed to the fixation part 11, and the front plate 1 is attached to the stage 10 through an adhesive layer. In this manner, the front plate 1 is placed on the stage 10. The attachment of the front plate 1 to the stage 10 may be performed before, after, or simultaneously with the attachment of the first display panel 2 to the carrier sheet 4.

After the preparation process, as described above, image data of the alignment marks 71 and the display-panel-side alignment marks 75 is acquired by the camera 7, and position alignment of the display panel 2 and the front plate 1 is performed. Thereafter, a decompression process that performs decompression in the vacuum chamber 5 is performed. The control device 30 controls the pressure in the vacuum chamber 5 by controlling operation of the vacuum source 51.

After the pressure in the vacuum chamber 5 becomes predetermined pressure, a press bonding process that bonds the display panel 2 to the front plate 1 is performed. As illustrated in FIG. 6, the control device 30 sets the vertical movement device 65 to a moving-up state, thereby reducing the distance between the installation table 61 and the installation table 63.

As a result, the distance between the carrier sheet 4 and the fixation part 11 of the stage 10 decreases, and the first display panel 2 attached to the carrier sheet 4 and the front plate 1 contact each other. In the press bonding process, the first display panel 2 together with the carrier sheet 4 is sandwiched between the elastic body 20 and the front plate 1 when the front plate 1 contacts the first display panel 2.

In a removing process after the press bonding process, as illustrated in FIG. 7, the control device 30 sets the vertical movement device 65 to a moving-down state, thereby increasing the distance between the installation table 61 and the installation table 63. Accordingly, the carrier sheet 4 is removed from the first display panel 2 while the first display panel 2 and the front plate 1 are bonded to each other.

Subsequently, as illustrated in FIG. 7, the second display panel 2 (display panel 2-3) is attached to the carrier sheet 4 through an adhesive layer. The carrier sheet 4 is positioned to a predetermined position where the second display panel 2 overlaps the front plate 1 in a plan view, the predetermined position being different from the position where the first display panel 2 is attached. Subsequently, position alignment of the second display panel 2 and the front plate 1 is performed, and then in the press bonding process as described above, although not illustrated, the control device 30 sets the vertical movement device to the moving-up state, thereby reducing the distance between the installation table 61 and the installation table 63.

In the removing process after the press bonding process, as illustrated in FIG. 8, the control device 30 sets the vertical movement device to the moving-down state, thereby increasing the distance between the installation table 61 and the installation table 63. Accordingly, the carrier sheet 4 is removed from the second display panel 2 while the second display panel 2 and the front plate 1 are bonded to each other.

Subsequently, as illustrated in FIG. 8, the third display panel 2 (display panel 2-2) is attached to the carrier sheet 4 through an adhesive layer. The carrier sheet 4 is positioned to a predetermined position where the third display panel 2 overlaps the front plate 1 in a plan view, the predetermined position being different from the position where the first display panel 2 and the second display panel are attached. Subsequently, position alignment of the third display panel 2 and the front plate 1 is performed, and then the press bonding process is performed as described above, although not illustrated. Then, the removing process is performed.

Subsequently, the pressure in the vacuum chamber 5 is returned to atmospheric pressure, and the display device 3 illustrated in FIGS. 1 and 2 is taken out.

Figure 9:
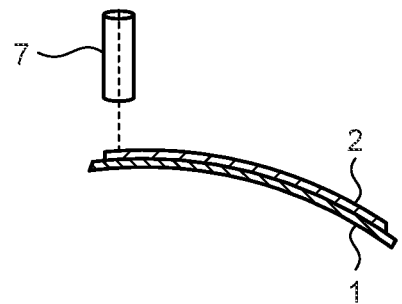
FIG. 9 is an explanatory diagram for describing an exemplary method of detecting the position accuracy of the display panel bonded to the front plate.
Figure 10:
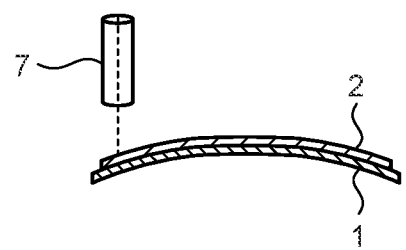
FIG. 10 is an explanatory diagram for describing an exemplary method of detecting the position accuracy of a display panel bonded to a front plate according to a comparative example.

FIG. 9 is an explanatory diagram for describing an exemplary method of detecting the position accuracy of a display panel bonded to a front plate. FIG. 10 is an explanatory diagram for describing an exemplary method of detecting the position accuracy of a display panel bonded to a front plate according to a comparative example. In the examples illustrated in FIGS. 9 and 10, one display panel 2 is bonded to the front plate 1 for simplicity of the description.

As illustrated in FIG. 9, after the display panel 2 is bonded to the front plate 1, the position accuracy of the display panel 2 is checked with the camera 7. In this case, the positional relation between the alignment mark 71 and the display-panel-side alignment mark 75 illustrated in FIG. 4 is detected while the camera 7 is disposed in the normal direction of the display panel 2. Specifically, the control device 30 calculates a distance W1 between the display-panel-side alignment mark 75 and the side S1 and a distance W2 between the display-panel-side alignment mark 75 and the side S2 based on image data from the camera 7. When the distances W1 and W2 are each in a predetermined range, it is determined that the display panel 2 has no positional error.

However, in the comparative example illustrated in FIG. 10, the normal direction of the display panel 2 and the position of the camera 7 are shifted from each other when the display panel 2 is disposed at a tilt. In this case, the positional relation between the alignment mark 71 and the display-panel-side alignment mark 75 illustrated in FIG. 4 is differently detected in accordance with the tilt of the display panel 2. For example, when the display panel 2 is tilted, the distance W1 is detected to be short as compared to FIG. 9 and the position accuracy of the display panel 2 cannot be accurately detected in some cases. Furthermore, the distance W1 is potentially differently detected in accordance with the magnification and focal length of the camera 7. Alternatively, edges of the alignment mark 71 potentially cannot be excellently detected after the display panel 2 is bonded to the front plate 1.

Figure 11:
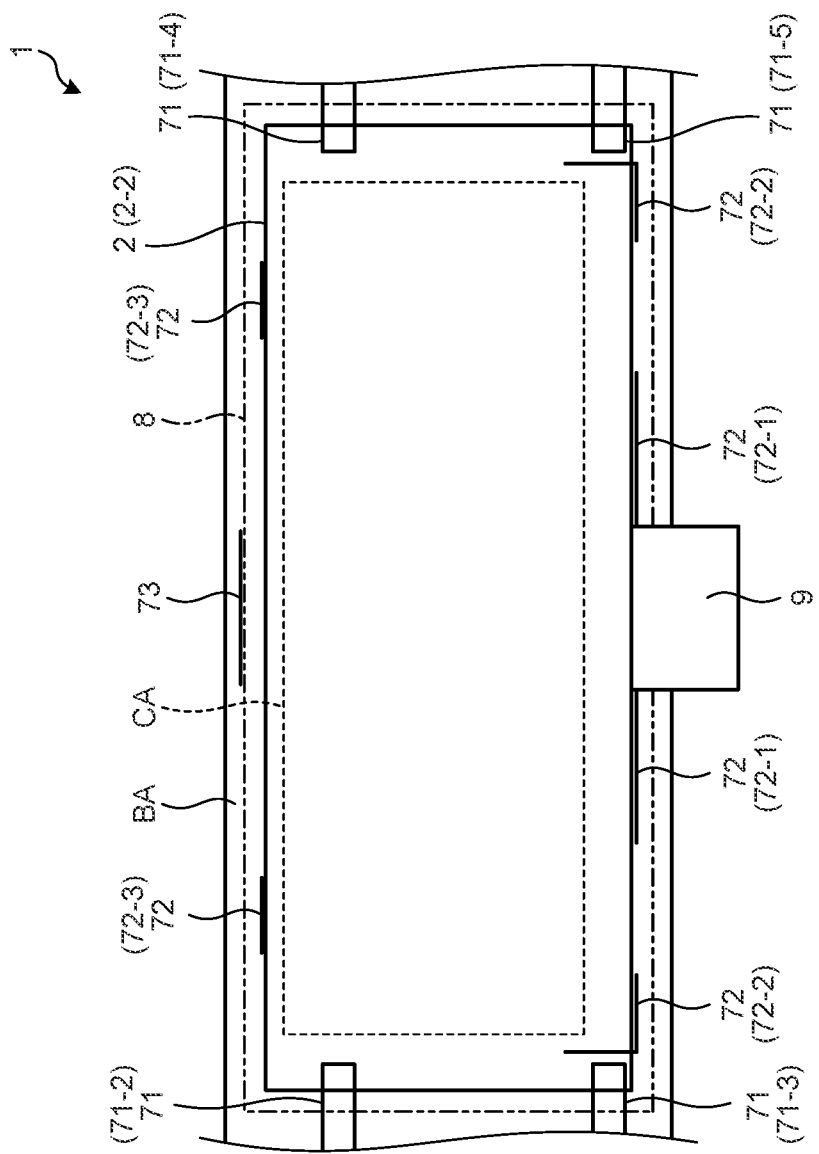
FIG. 11 is a plan view illustrating part of the display device according to the first embodiment in an enlarged manner.

FIG. 11 is a plan view illustrating part of the display device according to the first embodiment in an enlarged manner. The backlight 8 is illustrated with a dashed and double-dotted line in FIG. 11. As illustrated in FIGS. 2, 3, and 11, the first marks 72 are provided on the front plate 1 in the present embodiment. With this configuration, after the display panel 2 is bonded to the front plate 1, the position accuracy of the display panel 2 can be easily checked by detecting the outer periphery of the display panel 2 and the positions of the first marks 72. The position accuracy of the display panel 2 may be checked based on image data captured by the camera 7 or may be visually checked.

More specifically, since the first marks 72-1 and 72-3 are provided along the bottom and top sides of the display panel 2, the position accuracy of the display panel 2 in the direction orthogonal to the one direction in which the first marks 72-1 and 72-3 extend can be easily checked based on the interval between each of the first marks 72-1 and 72-3 and a corresponding one of the bottom and top sides of the display panel 2 and based on the state of overlapping therebetween. Since the first marks 72-1 and the first marks 72-3 are arranged in the one direction, tilt of the display panel 2 in the one direction can be easily checked. Moreover, since the L-shaped first marks 72-2 and the first marks 72-4 each extending along a curved line part are provided as illustrated in FIGS. 2 and 3, the position accuracy of the display panel 2, such as the display panel 2-1 or 2-3 including a curved line part, in the one direction can be easily checked.

In the present embodiment, the second marks 73 are provided on the front plate 1. With this configuration, after the backlight 8 is bonded to the front plate 1 and the back surface of the display panel 2, the position accuracy of the backlight 8 can be easily checked by detecting the outer periphery of the backlight 8 and the positions of the second marks 73.

It should be noted that, position accuracy required for the backlight 8 is not as high as position accuracy required for the display panel 2, and the backlight 8 has a relatively large allowable range of positional error in some cases. Thus, the second marks 73 only need to be provided along at least one side of the backlight 8 or no second marks 73 may be provided.

In the first embodiment, the display device 3 is attached to, for example, the dashboard of a vehicle. Since the surface of the front plate 1 of the display device 3 is curved, the surface of the display device 3 is smoothly connected to a curved interior decoration of the vehicle, which is an advantage. Each display panel 2 displays, for example, navigation, a speed meter, a tachometer, a fuel meter, or a water temperature meter.

It should be noted that, the display device 3 does not necessarily need to be mounted on a vehicle but may be applied to another electronic apparatus such as a portable terminal. When the display device 3 is mounted on a vehicle, images displayed on the display device 3 are not limited to meters and gauges of the vehicle but may be, for example, a car navigation map.

It should be noted that, the display panel 2 may be an organic EL panel. No backlight is needed when the display panel 2 is an organic EL panel. The display panel 2 may have a touch detection function. Specifically, a touch panel may be provided inside the display panel 2 or on the surface of the display panel 2.

It should be noted that, the front plate 1 does not necessarily need to be formed of glass. The front plate 1 may be formed of, for example, translucent synthesis resin.

As described above, the display device 3 of the present embodiment includes the front plate 1 including the display region CA that is translucent and the peripheral region BA that is different from the display region CA, and the display panels 2 provided opposite at least the display region CA of the front plate 1. The front plate 1 includes the alignment marks 71 provided in the peripheral region BA at positions corresponding to the display-panel-side alignment marks 75 provided on each display panel 2, and the first marks 72 each having a linear shape and extending along the outer periphery of the display panel 2.

With this configuration, the control device 30 can perform position alignment of the front plate 1 and the display panel 2 by performing image recognition of the display-panel-side alignment marks 75 and the alignment marks 71 based on image data from the camera 7. Then, after the front plate 1 and the display panel 2 are bonded to each other, the position accuracy of the display panel 2 can be easily checked by observing the positional relation between each of the first marks 72 having a linear shape and the outer periphery of the display panel 2. Moreover, since the first marks 72 different from the alignment marks 71 are provided, it is possible to reduce variance in position detection accuracy due to the difference between the tilt of the display panel 2 and the direction of observation with the camera 7 as compared to a case in which the position accuracy of the display panel 2 is checked by using the alignment marks 71 and the display-panel-side alignment marks 75 after the front plate 1 and the display panel 2 are bonded to each other.

MODIFICATION

Figure 12:
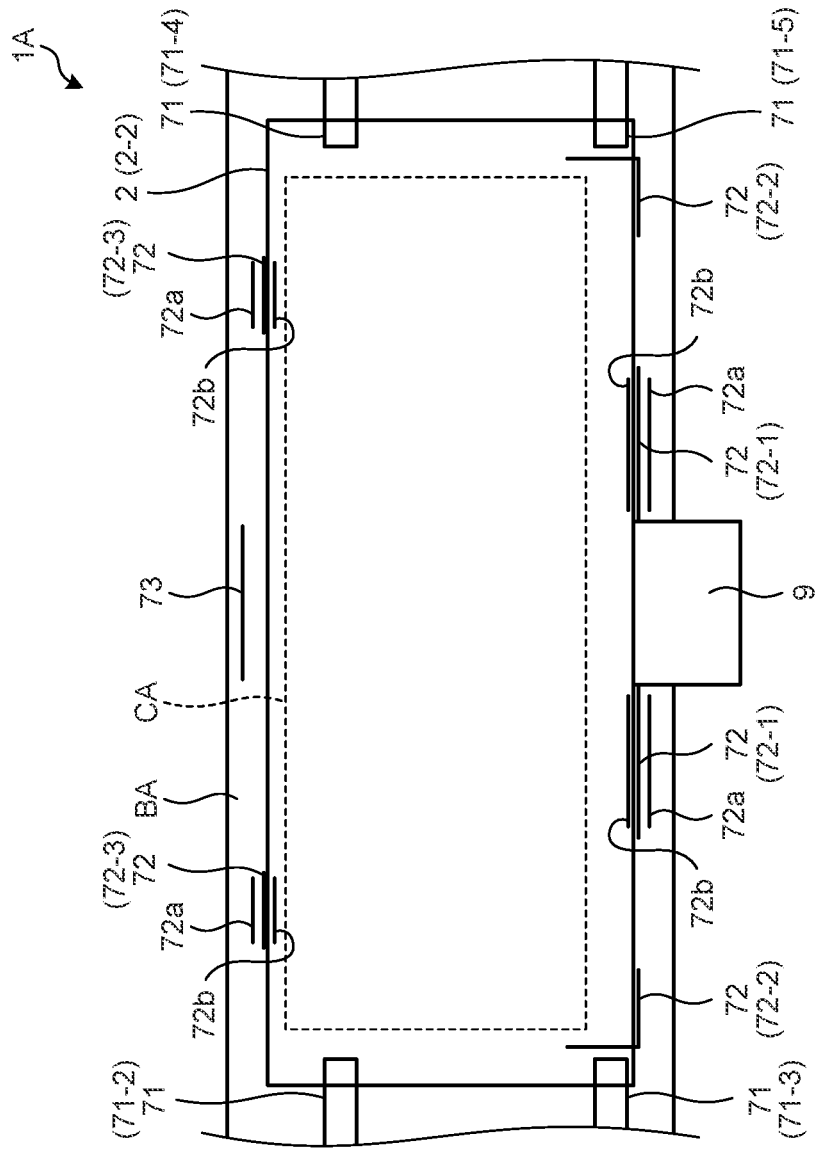
FIG. 12 is a plan view illustrating part of a display device according to a modification of the first embodiment in an enlarged manner.

FIG. 12 is a plan view illustrating part of a display device according to a modification of the first embodiment in an enlarged manner. It should be noted that, in the following description, the same constituent component as in the above-described embodiment is denoted by the same reference sign, and duplicate description thereof is omitted.

As illustrated in FIG. 12, a front plate 1A of the modification includes a plurality of sub marks 72a and 72b in addition to the first marks 72. More specifically, the sub marks 72a and 72b are arrayed alongside the first marks 72-1 and 72-3 in a direction orthogonal to the outer periphery of each display panel 2. The lengths of the sub marks 72a and 72b in the extending direction are shorter than those of the first marks 72 so that the sub marks 72a and 72b can be distinguished from the first marks 72.

In the present modification, the first marks 72 are each disposed between the sub marks 72a and 72b in the direction orthogonal to the outer periphery of the display panel 2. More specifically, the sub marks 72a are each disposed between a corresponding one of the first marks 72-1 and 72-3 and the outer periphery of the front plate 1A. The sub marks 72b are each disposed between a corresponding one of the first marks 72-1 and 72-3 and the outer periphery of the corresponding display region CA of the front plate 1A.

In the present modification, it is possible to easily check the magnitude of positional error of the display panel 2 by checking the positional relation between the outer periphery of the display panel 2 and each of the first marks 72 and the sub marks 72a and 72b after the display panel 2 and the front plate 1A are bonded to each other.

In FIG. 12, two sub marks 72a and two sub marks 72b are provided for each first mark 72. The present invention is not limited thereto, and three or more sub marks 72a and three or more sub marks 72b may be provided for each first mark 72. In FIG. 12, the sub marks 72a and 72b are provided for the first marks 72-1 and 72-3 that linearly extend. However, the present invention is not limited thereto, and the sub marks 72a and 72b may be provided for the first marks 72-2 that are L-shaped or the first marks 72-4 (refer to FIG. 3) that extend at a tilt relative to the one direction.

Second Embodiment

Figure 13:
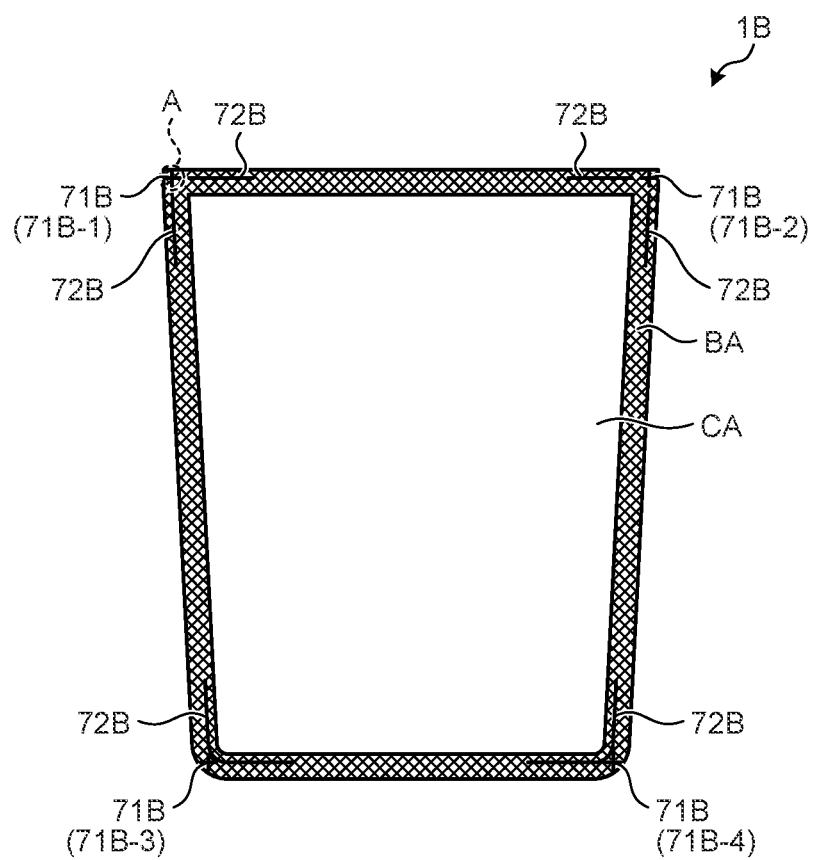
FIG. 13 is a schematic plan view of a front plate according to a second embodiment.
Figure 14:
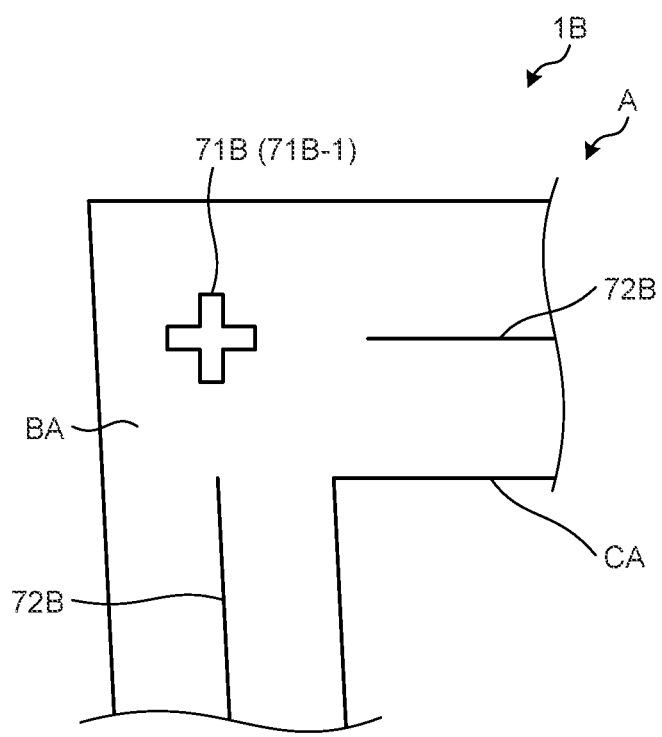
FIG. 14 is a plan view illustrating a region A in FIG. 13 in an enlarged manner.

FIG. 13 is a schematic plan view of a front plate according to a second embodiment. FIG. 14 is a plan view illustrating a region A in FIG. 13 in an enlarged manner. The first embodiment and the modification describe the example in which the front plate 1 includes a curved surface part and a plurality of display panels 2 are bonded to the one front plate 1, but the present invention is not limited thereto.

As illustrated in FIG. 13, a front plate 1B of the second embodiment has a flat plate shape, and one display panel 2 (not illustrated in FIG. 13) is bonded opposite one display region CA. The display region CA has a substantially quadrangular shape, and has a trapezoid shape in the example illustrated in FIG. 13. The peripheral region BA is formed in a frame shape surrounding the display region CA. However, the present invention is not limited thereto, and the display region CA may have another shape such as a rectangular shape, a polygonal shape, or a circular shape.

As illustrated in FIGS. 13 and 14, alignment marks 71B and first marks 72B are provided on the front plate 1B in the present embodiment. The alignment marks 71B each have a cross shape and are disposed at respective corners of the peripheral region BA. The first marks 72B are provided near the alignment marks 71B and are disposed at the respective corners of the peripheral region BA.

At a part close to the top side of the peripheral region BA, each first mark 72B having a linear shape, extending in the one direction, and provided on the top side of the peripheral region BA is disposed with separation from the corresponding first marks 72B having a linear shape, extending in a direction intersecting the one direction, and provided on the left-hand side and the right-hand side of the peripheral region BA. Alignment marks 71B-1 and 71B-2 are each disposed with separation from the corresponding first marks 72B and positioned at the intersection of extended lines of the first marks 72B.

At a part close to the bottom side of the peripheral region BA, each first mark 72B having a linear shape is provided in a curved line shape along the corresponding corner of the display region CA. Alignment marks 71B-3 and 71B-4 are each provided outside the corresponding first mark 72B and between the first marks 72B and the outer periphery of the front plate 1B.

In the present embodiment, the alignment marks 71B and the first marks 72B are each provided at the corresponding corner of the display panel 2 after the display panel 2 and the front plate 1B are bonded to each other. Thus, it is possible to check the position accuracy of the display panel 2 with the first marks 72B provided at the four corners of the display panel 2. It should be noted that, the present invention is not limited thereto, and the first marks 72B may be provided along the four sides of the display panel 2.

Third Embodiment

Figure 15:
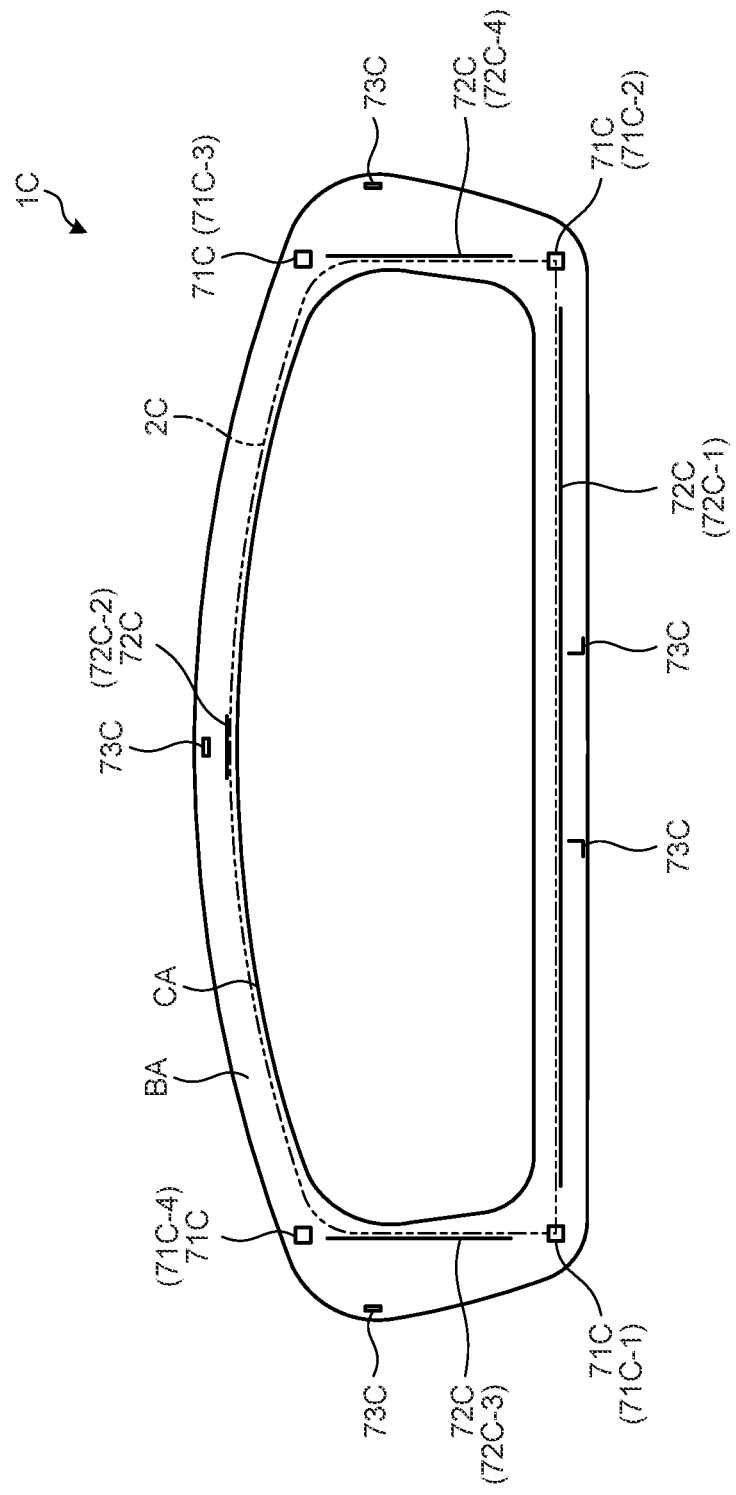
FIG. 15 is a schematic plan view of a display device according to a third embodiment.

FIG. 15 is a schematic plan view of a display device according to a third embodiment. In FIG. 15, a display panel 2C is illustrated with a dashed and double-dotted line for simplicity of the drawing. Although not illustrated, similarly to the first embodiment, a front plate 1C and the display panel 2C of the present embodiment are a curved surface panel including a curved surface part in a sectional view. As illustrated in FIG. 15, the top side of the display panel 2C is formed in a curved line having an outwardly convex shape. The front plate 1C is formed in a curved line along which the top side thereof is curved in accordance with the display panel 2C and the left-hand side and the right-hand side thereof are tilted. The sides of the front plate 1C are coupled in a smooth curved line.

In the present embodiment, each of a plurality of alignment marks 71C has a quadrangular shape and is provided at a corresponding corner of the display panel 2C. Each of a plurality of first marks 72C has a linear shape and is provided along a corresponding one of the four sides of the display panel 2C.

A first mark 72C-1 is provided between alignment marks 71C-1 and 71C-2 adjacent to each other in the one direction and extends along the bottom side of the display panel 2C. A first mark 72C-2 is provided on a side opposite the first mark 72C-1 with the display region CA interposed therebetween. The first mark 72C-2 is provided between alignment marks 71C-3 and 71C-4 adjacent to each other in the one direction and extends along part of the top side of the display panel 2C.

The first mark 72C-3 is provided between the alignment marks 71C-1 and 71C-4 adjacent to each other in the direction orthogonal to the one direction and extends along the left-hand side of the display panel 2C. A first mark 72C-4 is provided on a side opposite the first mark 72C-3 with the display region CA interposed therebetween. The first mark 72C-4 is provided between the alignment marks 71C-2 and 71C-3 adjacent to each other in the direction orthogonal to the one direction and extends along the right-hand side of the display panel 2C. In the present embodiment, the first marks 72C-1, 72C-3, and 72C-4 are formed long along sides extending straight on the outer periphery of the display panel 2C. Accordingly, it is possible to easily check the position accuracy and tilt of the display panel 2C after the display panel 2C and the front plate 1C are bonded to each other.

Second marks 73C are provided on the four sides of the peripheral region BA and each positioned between the corresponding first mark 72C and the outer periphery of the front plate 1C.

It should be noted that, components of the embodiments and the modification described above may be combined as appropriate. For example, the alignment marks 71B and the first marks 72B illustrated in FIGS. 13 and 14 may be employed on the front plate 1 or 1C, or the alignment marks 71C, the first marks 72C, and the second marks 73C illustrated in FIG. 15 may be employed on the front plate 1 or 1B.

Alternatively, the sub marks 72a and 72b illustrated in FIG. 12 may be employed on the front plate 1B or 1C.

Preferable embodiments of the present disclosure are described above, but the present disclosure is not limited to such embodiments. Contents disclosed in the embodiments are merely exemplary, and various kinds of modifications are possible without departing from the scope of the present disclosure. Any modification performed as appropriate without departing from the scope of the present disclosure belongs to the technical scope of the present disclosure. At least one of omission, replacement, and change of various constituent components may be performed without departing from the scope of the embodiments and the modification described above.

What is claimed is:

1. A display device comprising:
   a front plate including a plurality of display regions having a light-transmitting property and a peripheral region disposed around an outer periphery of the display region; and
   a plurality of display panels provided facing the display regions of the front plate, the display panels including a first display panel and a second display panel adjacent to the first display panel,
   wherein
   the front plate includes
      a plurality of alignment marks provided in the peripheral region at positions corresponding to a plurality of display-panel-side alignment marks provided on the display panels; and
      a plurality of first marks each having a linear portion extending in a first direction along the outer periphery of the display panel,
   the first marks include a linear mark provided along a side of the display panel, and an L-shaped mark provided on the front plate and corresponding to a corner of the first display panel,
   the alignment marks of the front plate include a common alignment mark provided at a position adjacent to the L-shaped marks and corresponding to two of the display-panel-side alignment marks respectively provided on the first display panel and the second display panel,
   the L-shaped mark overlaps an area of the first display panel, the area being between the common alignment mark and one of the display regions adjacent to the common alignment mark in the first direction, and
   the front plate and the display panel are positioned such that the L-shaped mark intersects with an edge of the display panel in a plan view.

2. A display device comprising:
   a front plate including a display region having a light-transmitting property and a peripheral region disposed around an outer periphery of the display region;
   a display panel provided opposite at least the display region of the front plate; and
   a backlight,
   wherein
   the front plate includes
      a plurality of alignment marks provided in the peripheral region at positions corresponding to a plurality of display-panel-side alignment marks provided on the display panel,
      a plurality of first marks each having a linear shape and extending along the outer periphery of the display panel;
      a plurality of sub-marks disposed along a first direction and adjacent to the first marks in a second direction intersecting the first direction and orthogonal to the outer periphery of the display panel, the sub-marks including a first sub-mark and a second sub-mark, and
      a second mark provided between an extending area of a corresponding one of the first marks in the first direction and an outer periphery of the front plate, and
   the front plate and the display panel are positioned such that:
      the sub marks the second sub-mark overlaps with the display panel in a plan view; and
      the first sub-mark does not overlap with the display panel in the plan view, and
   the backlight and the front plate are positioned such that at least a part of the second mark is exposed to the backlight in the plan view.

3. The display device according to claim 2, wherein the alignment marks and the first marks are each provided at a corresponding corner of the display panel.

4. The display device according to claim 2, wherein the alignment marks are each provided at a corresponding corner of the display panel, and the first marks are each provided along a corresponding one of four sides of the display panel.

5. The display device according to claim 2, wherein the front plate includes a curved surface part,
   a plurality of the display regions are arrayed on the front plate, and
   a plurality of the display panels are provided in correspondence with the display regions and curved along and bonded to the front plate.

6. The display device according to claim 2, wherein
   a length of the sub-marks along the outer periphery of the display panel is smaller than a length of the first marks.

* * * * *